INTEGRATED PLANAR VARACTOR DIODE

Original Filed Oct. 24, 1966 4 Sheets-Sheet 1

INVENTOR
George D. Vendelin
Roger R. Webster
BY Kenneth R. Glaser
ATTORNEY

United States Patent Office 3,559,005

Patented Jan. 26, 1971

3,559,005

INTEGRATED PLANAR VARACTOR DIODE

George D. Vendelin, Richardson, and Roger R. Webster, Dallas, Tex., assignors to Texas Instruments Incorporated, Dallas, Tex., a corporation of Delaware Continuation of application Ser. No. 589,003, Oct. 24, 1966. This application Mar. 7, 1969, Ser. No. 806,046
Int. Cl. H01l 5/00
U.S. Cl. 317—234 6 Claims

ABSTRACT OF THE DISCLOSURE

Disclosed in a planar varactor diode and a method of producing the same for integrated applications, especially at high frequencies. This diode has low leakage currents, improve reverse bias characteristics, and reduced junction and MOS capacitance. The low leakage currents are obtained by minimizing the surface perimeter of the device, the low junction capacitance is attained by reducing the junction area of the two active regions and the reduced MOS capacitance is achieved by forming a cavity beneath the contact of the anode region or by offsetting the anode region underneath the anode contact.

This application is a continuation of our copending application Ser. No. 589,003, filed Oct. 24, 1966, entitled Integrated Planar Varactor Diode," now abandoned.

This invention relates to semiconductor fabrication processes and devices, and in particular to a planar varactor diode for integrated circuit applications having requirements of low leakage currents and improved reverse bias voltage characteristics.

Conventional microwave devices are not adaptable to monolithic integrated circuit structures and are further limited for use at high frequencies by package inductance and capacitance. Recent attempts to fabricate microwave diodes in integrated circuit structures so as to reduce stray capacitance losses have centered around the so-called surface-oriented concept. In a surface-oriented diode, the anode and cathode contacts emerge at the surface of the wafer and the diode junction is disposed essentially perpendicular to the surface of the wafer.

An important feature of the surface-oriented varactor structure is a low series resistance. This is achieved by diffusing the anode through an epitaxial layer into the underlying substrate, as illustrated in my co-pending application, Ser. No. 510,491, filed Nov. 23, 1965, for a Surface-Oriented Varactor Diode now U.S. Pat. No. 3,396,317 issued Aug. 6, 1968. All of the effective diode capacitance is perpendicular to the surface and in series with the minimum resistance. The capacitance which would usually appear parallel to the surface is reduced in magnitude by diffusing the anode through the epitaxial layer and by using a high resistivity substrate.

In many microwave applications it is of the utmost importance that the value of Q for the diode be high. The value of Q is expressed by the equation $$Q=\frac{1}{2\pi fRC}$$

Where $f$ is the frequency, C the capacitance measured across the diode terminals, and R the series resistance also measured across the diode terminals. The cutoff frequency of the diode occurs when $Q=1$. As a practical matter, a varactor diode must be operated at a low enough frequency to maintain a Q greater than 10. It is evident that if a diode is to be operated at high frequencies the RC product must be reduced to a very low value by the design of the diode. A semiconductor diode has an inherent capacitance across the P-N or P-I-N junction (I indicating a high resistivity region between the anode and cathode regions) which is determined generally by the width of the reverse bias depletion layer and the areas of the opposed boundaries of the depletion layer which may be considered as capacitor plates. Since the width of the depletion layer changes with changes in the magnitude of the reverse bias, the capacitance also changes with a change in the magnitude of the reverse bias. This features is used to advantage in some reactive circuits such as harmonic generators where the diode is referred to as a varactor.

The conventional packaged diode also has stray and parasitic capacitance as a result of the packaging. For very high frequency application (such as above KU Band), the stray and parasitic capacitance is generally greater than the limit permissible. At lower frequencies (such as X-Band) the parasitics of properly designed packages are not excessive, but nevertheless restrict the possible freedom of use, and are thus undesirable.

One of the factors which influences leakage currents is the surface perimeter of the device. N conductivity type regions surfacing on a silicon device are believed to be a major cause of leakage currents. As is well known in the art, the maximum permissible reverse bias voltage (commonly referred to as breakdown voltage) is generally increased when leakage currents are reduced. The limit of improvement is reached when the breakdown of the device is all within the device, rather than at the surface. Reducing the perimeter and improving the surface condition both minimize the leakage current.

A limitation of the surface-oriented varactor structure is the existence of a shunting metal-oxide-semiconductor (MOS) capacitor due to the connecting lead patterns which causes unwanted losses at microwave frequencies and leakage current at low frequencies. The MOS capacitance loss is generally caused by a potential voltage drop between a metallic conductor separated from an active semiconductor region by an oxide layer. The MOS capacitance thus increases the leakage current and parasitic capacitance.

It is therefore an object of this invention to provide a semiconductor diode having a reduced surface perimeter.

Another object of the invention is to provide a monolithic semiconductor diode having a very low RC product and therefore a high Q and a high cutoff frequency.

Another object of the invention is to provide a device geometry wherein the parasitic MOS capacitance is minimized.

Still another object is to provide a diode wherein the junction capacitance tends to decrease nonlinearly at a greater rate with an increase in reverse bias.

A further object is to provide a diode wherein very small junction areas and low junction capacitance can be obtained.

A still further object is to provide a diode with low parasitic reactance suitable for use at X-band and higher frequencies.

The novel features believed to be characteristic of this invention are set forth in the appended claims. The invention itself, however, as well as other objects and advantages thereof, may best be understood by reference to the following detailed description of illustrative embodiments, when read in conjunction with the accompanying drawings, wherein:

In brief, one embodiment of the invention comprises a semiconductor planar varactor diode in a silicon substrate with a P+ conductivity type anode region separated from a N+ conductivity type cathode contact region by an N conductivity type cathode region. The integraed planar varactor diode has low series resistance with the effective diode capacitance being parallel to the surface and in series with the minimum resistance due to the high resistivity epitaxial layer. The diode capacitance which is perpendicular to the surface due to both the anode and cathode emerging on the same surface of the substrate is minimized by reducing the diode surface perimeter. A small hole formed through the metallic anode contact and silicon oxide layer allows the elimination of certain portions of the semiconductor regions beneath the anode contact, thereby forming a cavity thereunder which serves to minimize the MOS capacitor which is inherently parallel to the diode prior to the removal of the semiconductor material. In another embodiment of the invention, the MOS capacitor effect is minimized not by an air dielectric cavity, as in the first embodiment, but by offsetting the anode region underneath the anode contact such that the portions of the other active regions of the diode beneath the anode contact are kept to a minimum.

Figure 1:
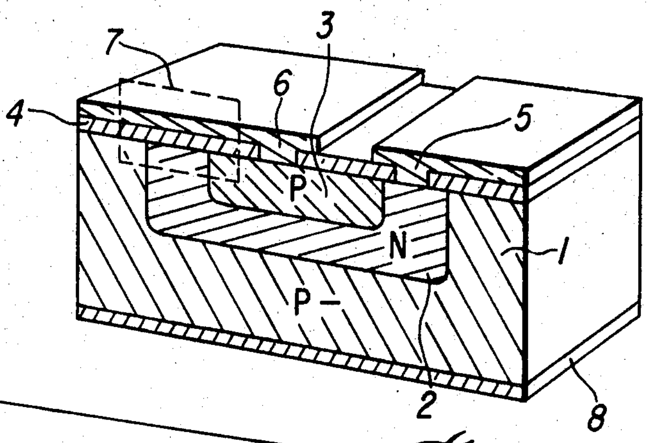
FIG. 1 is a pictorial view, partciularly in section, of a prior art diode.

Referring now to the figures of the drawing, FIG. 1 illustrates a conventional surface-oriented varactor diode. An N conductivity type region 2 which acts as the cathode of the diode is diffused or epitaxially deposited in the P-conductivity type substrate 1. The anode region 3 of the device is formed by diffusing a P conductivity type impurity into the N conductivity type cathode region 2 to form a P conductivity type region. The surface of the device is protected by a silicon oxide layer 4 which has holes patterned therein to allow the anode contact 6 to the P conductivity type region 3 and the cathode contact 5 to the N conductivity type region 2. The metal ground plane 8 is formed on the substrate 1 opposite the cathode and anode contacts 5 and 6. One of the principal disadvantages of such a device for use in microwave applications is the metal-oxide-semiconductor (MOS) capacitor, which is indicated by the dotted line 7. The MOS capacitor is in parallel with the varactor diode and is comprised of the metal anode contact 6, the oxide layer 4 and the N conductivity type region 2. Such a MOS capacitor decreases the cutoff frequency of the varactor diode and is generally undesirable due to capacitance losses and increased leakage currents.

The construction of the planar varactor diode in accordance with one embodiment of the present invention can be best understood by describing the stages of its fabrication as illustrated in FIGS. 2A–2L.

Figure 2A:
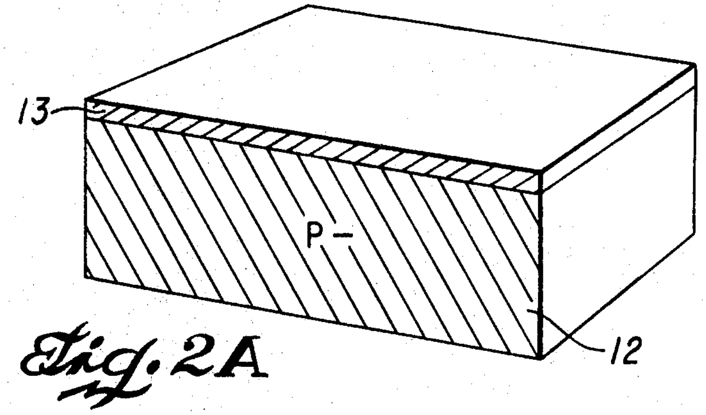
FIG. 2A–2L illustrate in a succession of pictorial views, partially in section, the fabrication steps of one embodiment of the invention.

The starting material for fabricating the diode is a very high resistivity substrate 12. For the most applications the substrate 12 should have as high a resistivity as possible, a resistivity greater than 1,500 ohms-centimeter being possible although the resistivity may vary for different applications. The substrate may be either P type or N type and may be either silicon or other semiconductor materials. In the preferred embodiment here being illustrated, substrate 12 is P-conductivity type silicon. The substrate 12 is placed in a suitable reactor furnace and heated to about 1200° C. to grow a thermal oxide masking layer 13 to a thickness of about 1 micrometer as indicated in FIG. 2A.

Figure 2B:
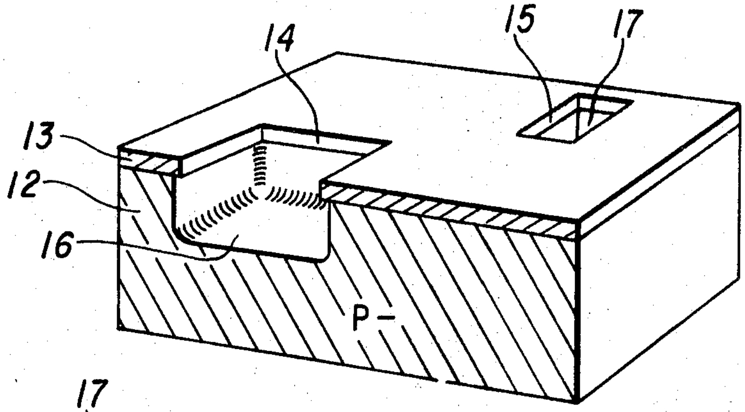

The oxide layer 13 is then patterned by conventional photoresist and etching techniques to leave openings 14 and 15. Next, the substrate 12 is subjected to an etchant for a period of time sufficient to etch cavities 16 and 17 in the areas exposed by the openings 14 and 15, as illustrated in FIG. 2B. Cavities 16 and 17 are made relatively deep, the depth being in the order of 40 micrometers.

Figure 2C:
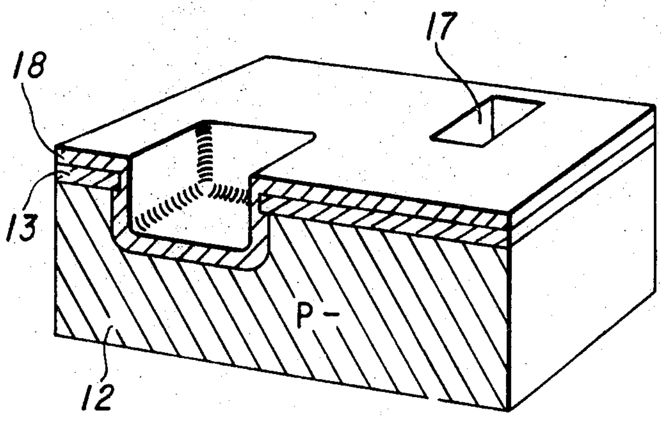

A second oxide 18 is then grown over the face of the wafer 12 as shown in FIG. 2C, using the thermal method previously described.

Figures 2D, 2E, 2F, 2G:
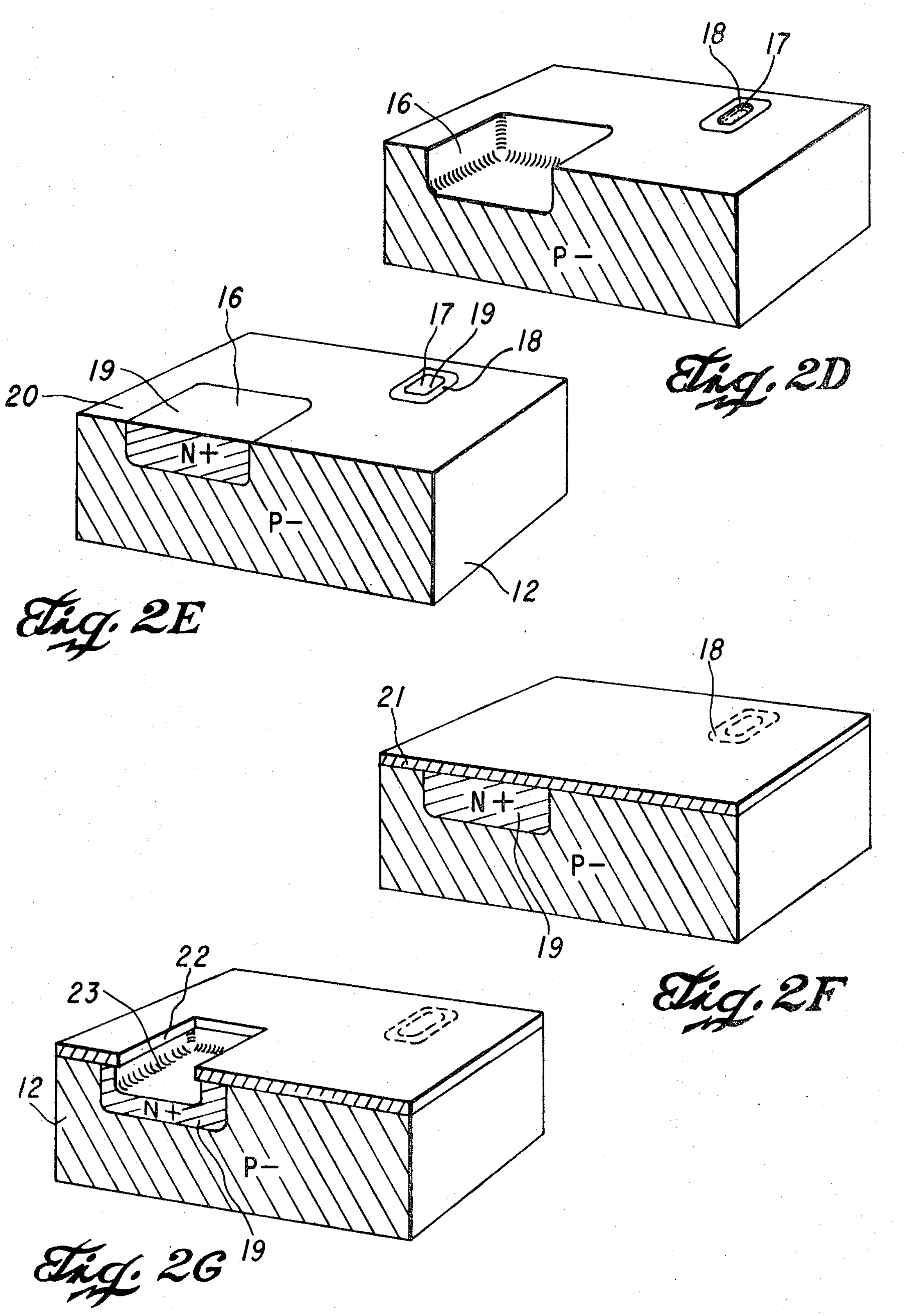

By using conventional photoresist and etching techniques substantially all of the silicon oxide 13 and 18 is removed, leaving only the portion of the oxide 18 which is in the cavity 17, as illustrated in FIG. 2D. The oxide 18 that is left in cavity 17 will be used as a convenient lapping stop to determine the necessary amount of lapping in subsequent steps of the process.

The substrate 12 is then placed in a conventional reactor furnace and a 0.1 ohm-cm. N+ conductivity type epitaxial deposit containing arsenic as the impurity material, for example, is built up over the face of substrate 12 until both cavities 16 and 17 are completely filled with the epitaxial material 19.

The substrate 12 is then mechanically lapped and polished to the original surface 20 of the substrate 12 to remove all the excess deposited material, as shown in FIG. 2E. The portion of the silicon oxide layer 18 in the epitaxially filled cavity 17 acts as a convenient stop or indicator of sufficient polishing. As the excess deposited material is removed by lapping and polishing, the edge of the oxide 18 that reaches the surface 20 of the substrate 12 will come into view. Since the oxide is of a different color than the silicon substrate 12, the correct amount of lapping is easily ascertainable visually. The oxide layer 18 also serves as an alignment pattern for subsequent masking operations. Although the lapping stop facilitates the diode fabrication, it can be eliminated where other means of lapping control or alignment are used.

An oxide layer 21 is then thermally grown on the surface of the substrate 12 to a thickness of approximately 1 micrometer, bringing the structure to the stage shown in FIG. 2F. Since the oxide layer 21 grows at a slower rate from the oxide 18 than from the remainder of the surface of the substrate 12, the oxide layer 21 above the oxide lapping stop 18 will be thinner than the remainder of the oxide 21. Because of the difference in color between the oxide over the lapping stop and the rest of the oxide, the lapping stop is used as an alignment aid throughout the remainder of the process. The thin oxide is indicated by the dotted lines defining the area of the oxide 18 beneath subsequent oxide layers.

The oxide layer 21 is patterned by conventional photoresist and etching techniques to leave an opening 22. Next, the substrate 12 is placed in a reactor and subjected to an etching condition for a period of time sufficient to etch a cavity 23 in the portion of the N+ conductivity type region 19 which is exposed by the opening 22, as shown in FIG. 2G. The cavity is very shallow and must be closely controlled, the depth being on the order of 5 micrometers.

Figures 2H, 2I, 2J, 2K:
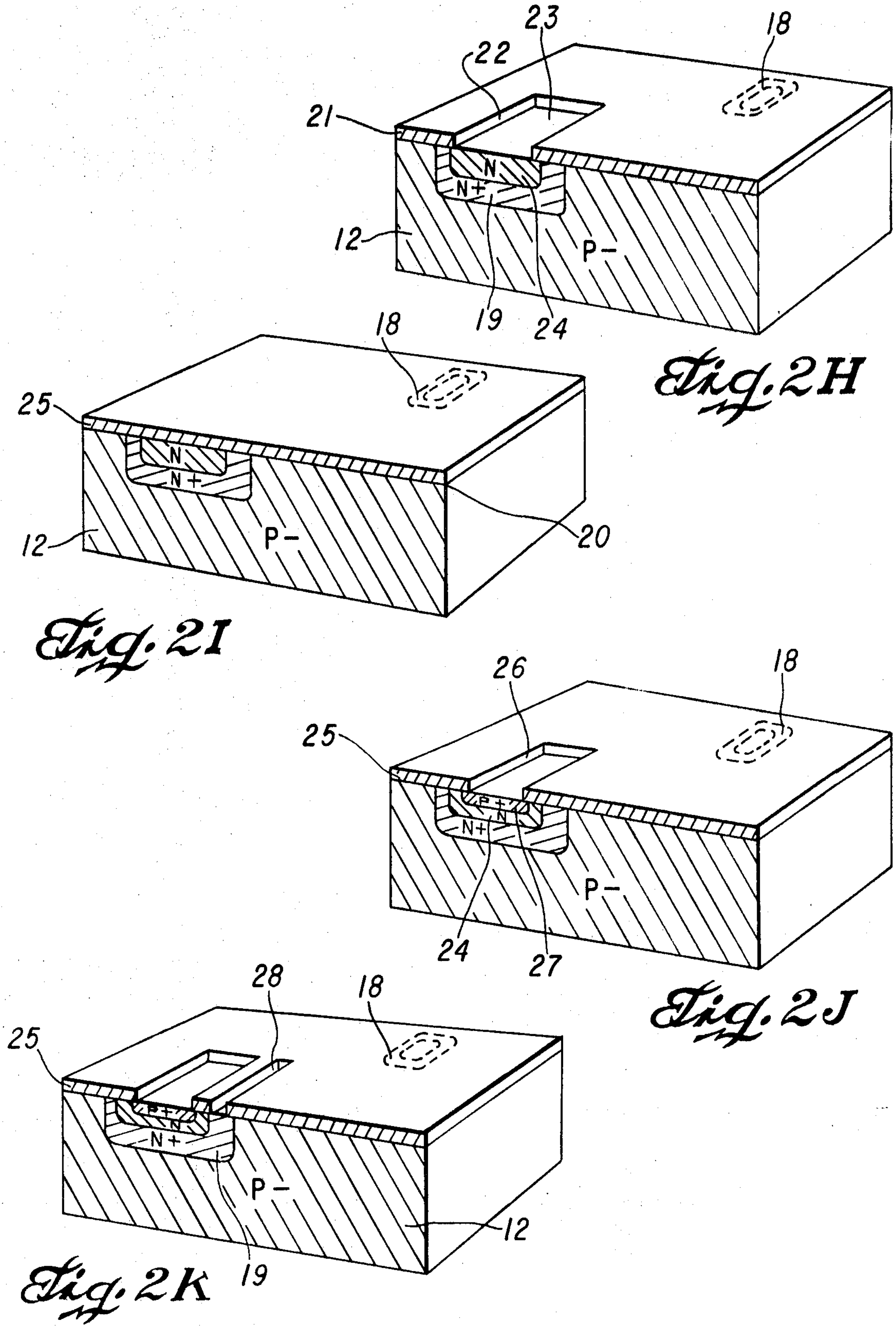

The next step in the process is to selectively refill cavity 23 with N conductivity type semiconductor material 24 by epitaxial deposition as shown in FIG. 2H. The material is doped with a suitable N conductivity type doping impurity, such as arsenic, to provide as low a resistance as possible and still provide the desired breakdown voltage. For example, silicon doped with arsenic to make 0.44 ohm-cm. resistivity material will provide about a 50 volt breakdown voltage when the thickness of the N type conductivity region is approximately 2.5 micrometers.

The epitaxial material 24 is deposited selectively only in the area exposed by the opening 22 in the oxide layer 21, as compared to the epitaxial material 19 that was previously deposited over the entire face 20 of the substrate 12.

Following the epitaxial deposition of N conductivity type material in cavity 23 to form region 24 as shown in FIG. 2H, the substrate 12 is partially lapped to remove any silicon overgrowth on the silicon oxide as a result of the epitaxial deposition of the N type material 24. The oxide 21 (FIG. 2H) is then completely removed by an etching process utilizing, for example, a chemical etch such as dilute hydrofloric acid. The oxide layer 25 is thereafter thermally grown by the process previously described to completely cover the face 20 of the substrate 12, as illustrated in FIG. 2I.

The oxide layer 25 is patterned by suitable photoresist and etch techniques to form the opening 26 over the N conductivity type material 24, as shown in FIG. 2J. By conventional diffusion techniques the P+ conductivity type anode region 27 is then formed to a depth of approximately 2.5 micrometers. The oxide layer 25 is further patterned by conventional photoresist and etch techniques to form the contact window 28 to the cathode contact region 19 of N+ conductivity type, as seen in FIG. 2K.

Figures 2L, 3:
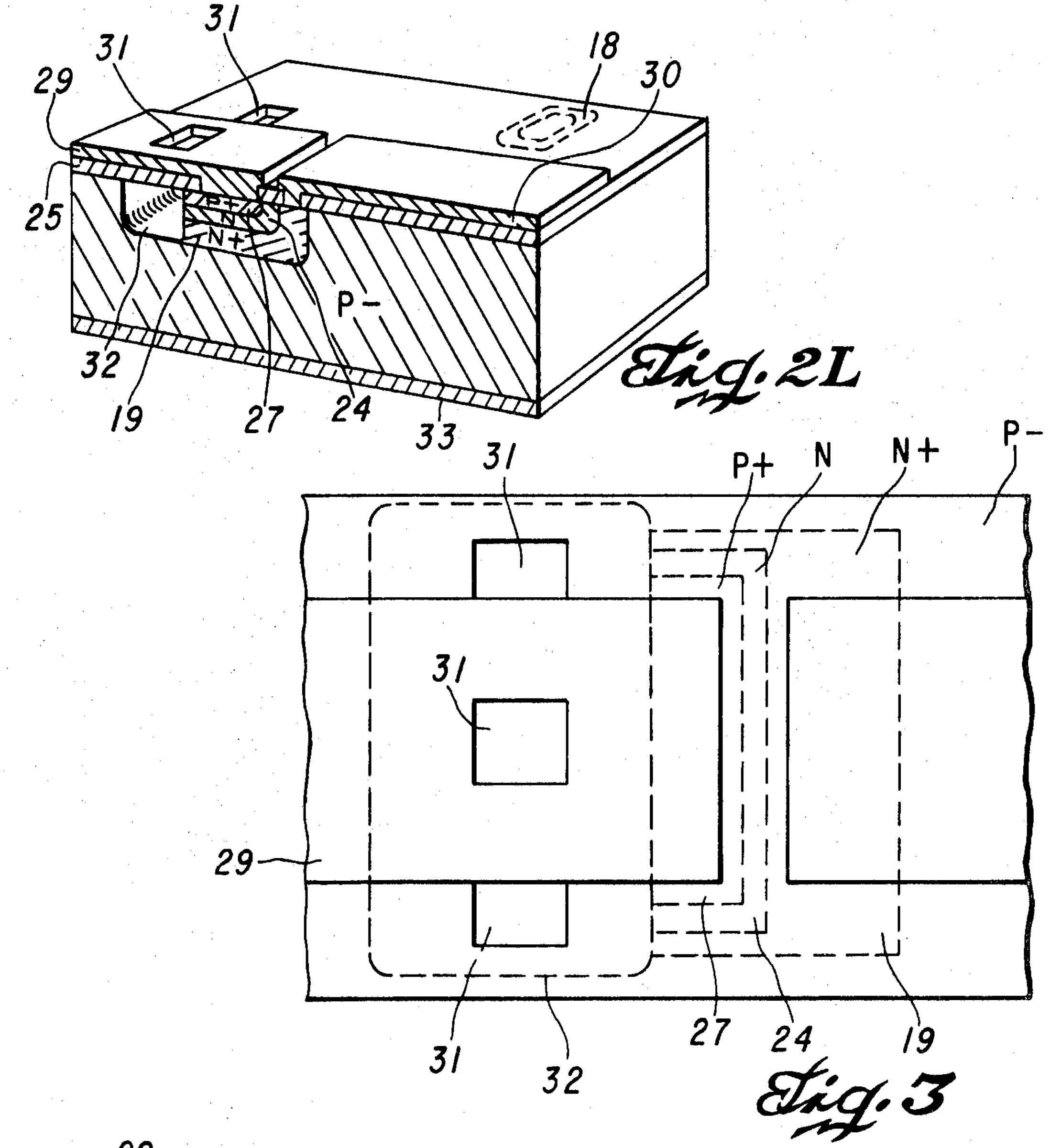
FIG. 3 is a plan view of the diode in FIG. 2L.

After the substrate 12 has reached the stage indicated by FIG. 2K, it is placed in a vacuum evaporator (not shown) and the top surface of the substrate completely covered with a metal such as aluminum. Again by the use of suitable photoresist and etch techniques the metal is selectively removed to form the anode contact 29 and the cathode contact 30 as shown in FIG. 2L. In addition, three windows 31 (one window not being shown), one in the anode contact 29 and one on either side of the anode contact window are formed by conventional photoresist and etch techniques for the purpose of exposing the underlying semiconductor material for a subsequent etch. Again by the use of conventional photoresist and etch techniques, the cavity 32 is formed beneath the anode contact 29, as illustrated in FIG. 2L. It will be noted that the cavity 32 is of such depth and width that only a very small portion of the N conductivity type cathode region 24 and N+ conductivity type cathode contact region 19 remain beneath the silicon oxide layer 25 that lies under the anode contact 29. In addition, the portion of the N conductivity type region 24 that previously surfaced beneath the silicon oxide 25 is reduced by the formation of the cavity 32, thereby reducing the surface leakage of the diode. The final fabrication step before evaporation is the deposition of the metallic ground plane 33 by conventional means.

In FIG. 3 there is shown a top view of a finished planar varactor diode (the remainder of the integrated circuit not being shown). The areas within the dashed lines are there indicated by the identical designation in FIG. 2L. Most of the N conductivity type region 24 and the N+ conductivity type region 19 beneath the metallic anode contact 29 has been removed, thereby minimizing the MOS capacitance loss.

Figure 4:
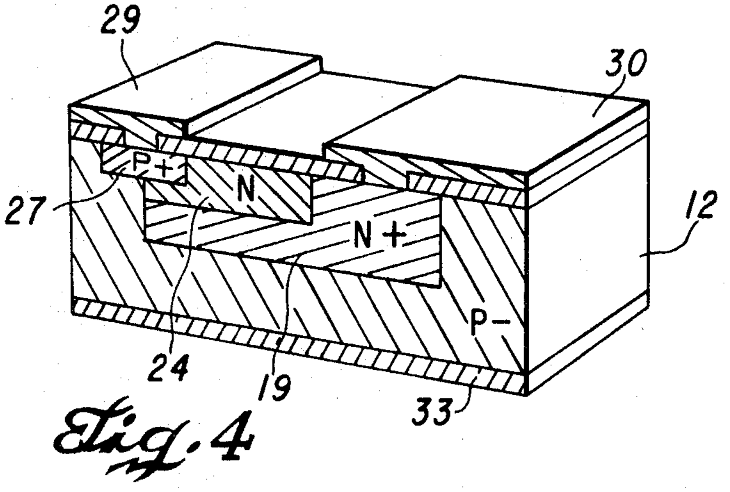
FIG. 4 is a pictorial view, partially in section, of another embodiment of the invention.

In FIG. 4 there is shown another embodiment of the invention where, instead of using a cavity beneath the metallic anode contact 29, the P+ conductivity type anode region 27 is offset from the N conductivity type conductivity type cathode region 24 and N+ conductivity type cathode contact region 19. The metallic layer 33 forms the ground plane of the device. By this technique, the amount of N conductivity type material beneath the metal anode contact 29 is also kept to a minimum, thus limiting the MOS capacitance loss.

Although the invention has been described using a P-conductivity type substrate, it is obvious that a diode could be made using a N-substrate with all the regions being of opposite conductivity type from those illustrated.

Although the preferred embodiments of the invention have been described in detail, it is to be understood that various changes, substitutions, and alterations can be made without departing from the spirit and scope of the invention. In addition, the dimensions of the different elements of the planar varactor diode as described are by way of illustration only and do not limit the invention in any way.

What is claimed is:

1. A semiconductor device, comprising:

(a) a high resistivity substrate of one conductivity type;

(b) a low resistivity first region of opposite conductivity type extending into said substrate from one surface of said substrate;

(c) a high resistivity second region of opposite conductivity type extending at least partially into said first region from said one surface of said substrate;

(d) a low resistivity third region of said one conductivity type extending into said second region from said one surface of said substrate;

(e) an insulating layer upon said one surface of said substrate;

(f) a first metal contact overlying a portion of said insulating layer and extending through an opening in said insulating layer over said second region;

(g) a second metal contact overlying a portion of said insulating layer and extending through another opening in said insulating layer into contact with said first region;

(h) means for reducing the surface perimeter and shunting capacity of said device comprising a cavity located beneath a portion of said insulating layer overlaid by said first metal contact and at least in said second region.

2. The semiconductor device of claim 1 in which said device is a diode and wherein:

(a) said conductivity type is P type and said opposite conductivity type is N type; and wherein (b) said first region is the cathode region of said diode and said first metal contact is the cathode contact of said diode; and wherein (c) said third region is the anode contact region of said diode and said second metal contact is the anode contact of said diode; and wherein (d) said second region is the cathode region of said diode which separates said cathode contact region from said anode contact region.

3. A semiconductor device comprising in combination:

(a) a semiconductor substrate of one conductivity type;

(b) a first region of opposite conductivity type positioned within said substrate, at least a portion of said first region extends to and terminates at one surface of said substrate;

(c) a second region of said one conductivity type at least partially positioned within said first region to form a PN junction, at least a portion of said second region extends to and terminates at said one surface adjacent said first region;

(d) a layer of oxide material overlying said one surface;

(e) a first metal contact overlying a portion of said oxide layer over said first region, a portion of said first metal contact extends through an opening in said oxide layer and makes contact with said first region;

(f) a second metal contact overlying a portion of said oxide layer over said second region but spaced from said first metal contact, a portion of said second metal contact extends through another opening in said oxide layer and makes contact with said second region; and (g) means for reducing the surface perimeter and shunting capacity of said device comprising a dielectric cavity located within said substrate below said second metal contact so that the portion of said oxide layer that is contiguous to said second metal contact mainly overlies said dielectric cavity and said substrate.

4. The semiconductor device of claim 3 in which said device is a diode and wherein:

(a) said one conductivity type is P tape and said opposite conductivity type is N type; and wherein (b) said first region is the cathode region of said diode and said first metal contact is the cathode contact of said diode; and wherein (c) said second region is the anode region of said diode and said second metal contact is the anode contact of said diode.

5. A semiconductor device comprising in combination:

(a) a semiconductor substrate of one conductivity type;

(b) a first region of opposite conductivity type positioned within said substrate, at least a portion of said first region extends to and terminates at one surface of said substrate;

(c) a second region of said opposite conductivity type at least partially positioned within said first region, at least a portion of said second region extends to and terminates at said one surface adjacent said first region;

(d) a third region of said one conductivity type at least partially positioned within said second region to form a PN junction, at least a portion of said third region extends to and terminates at said one surface adjacent said second region and spaced from said first region;

(e) a layer of oxide material overlying said one surface;

(f) a first metal contact overlying a portion of said oxide layer over said first region, a portion of said first metal contact extends through an opening in said oxide layer and make contact with said first region;

(g) a second metal conact overlying a portion of said oxide layer over said third region but spaced from said first metal contact, a portion of said second metal contact extends through another opening in said oxide layer and makes contact with said third region; and (h) means for reducing the surface perimeter and shunting capacity of said device comprising a dielectric cavity located within said substrate below said second contact so that the portion of said oxide layer that is contiguous to said second metal contact mainly overlies said third region, said dielectric cavity and said substrate, thereby substantially eliminating the physical location of said first and second regions from below said second contact.

6. The semiconductor device of claim 5 in which said device is a diode and wherein:

(a) said one conductivity type is P type and said other conductivity type is N type; and wherein (b) said first region is the cathode contact region of said diode and said first metal contact is the cathode contact of said diode; and wherein (c) said third region is the anode contact region of said diode and said second metal contact is the anode contact of said diode; and wherein (d) said second region is the cathode of said diode which separates said cathode contact region from said anode contact region.

References Cited

UNITED STATES PATENTS

| | | | |
|---|---|---|---|
| 3,244,949 | 4/1966 | Hilbiber | 317—235 |
| 3,271,201 | 9/1966 | Pomerantz | 317—235 |
| 3,359,462 | 12/1967 | Schutze et al. | 317—235 |
| 3,436,548 | 4/1969 | Biard et al. | 317—235 |

OTHER REFERENCES

IBM Tech. Discl. Bul., "Tunnel Diode Fabrication," by Gow et al., vol. 5, No. 12, May 1963, pp. 11–12.

Electronics, "Diode Sheds Its Costly Package With Beam Lead Construction," by Thomas et al., Jan. 24, 1966, pp. 77–71.

JERRY D. CRAIG, Primary Examiner

U.S. Cl. X.R.

148—179